United States Patent [19]

Yamaguchi

[11] Patent Number: 4,859,498
[45] Date of Patent: Aug. 22, 1989

[54] CHIP COMPONENT HOLDING PLATE

[75] Inventor: Masami Yamaguchi, Nagaokakyo, Japan

[73] Assignee: Murata Manufacturing Co., Ltd., Japan

[21] Appl. No.: 122,008

[22] Filed: Nov. 18, 1987

[51] Int. Cl.⁴ ............................................. B05D 5/12
[52] U.S. Cl. ..................................... 427/96; 118/500; 269/8; 269/903
[58] Field of Search .............. 118/500; 427/96; 269/8, 269/903

[56] References Cited

U.S. PATENT DOCUMENTS

| 3,951,495 | 4/1976 | Donaher | 439/357 |
| 4,381,321 | 4/1983 | Braden | 427/284 |
| 4,393,808 | 7/1983 | Braden | 118/503 |
| 4,395,184 | 7/1983 | Braden | 29/759 |
| 4,526,129 | 7/1985 | Braden | 118/503 |
| 4,664,943 | 5/1987 | Nitta | 118/500 |

Primary Examiner—Shrive Beck
Assistant Examiner—Vi D. Dang
Attorney, Agent, or Firm—Ostrolenk, Faber, Gerb & Soffen

[57] ABSTRACT

A chip component holding plate includes a sheet member composed of silicon rubber, on which a number of quadrilateral through holes each of which is capable of holding a chip component therein are formed. A plate composed of stainless steel is formed on one main surface of the sheet member. On the stainless steel plate, a number of circular through holes each of which has a diameter larger than an inside width of each quadrilateral through holes of the sheet member are formed at positions respectively corresponding to the respective through holes of the sheet member. In the state that the chip components are respectively press-inserted into the respective through holes of the sheet member, the stainless steel plate is magnetically attracted by a magnet plate. Then, the magnet plate is moved so that end portions of the respective chip components being held by the sheet member are pressed onto a silver paste which is spread on a plate, whereby an electrode is applied on the end portion of each chip component.

11 Claims, 3 Drawing Sheets

CHIP COMPONENT HOLDING PLATE

BACKGROUND OF THE INVENTION

1. Field of the Invention

The present invention relates to a chip component holding plate. More specifically, the present invention relates to a chip component holding plate which is utilized, for example, for holding components while applying external electrodes thereto, such as for use with a super-miniature monolithic ceramic capacitor, resistor, etc., and a method for applying and electrode onto a chip electronics component by employing such a holding plate.

2. Description of the Prior Art

Conventionally, a holding plate which is used when applying an external electrode onto a chip electronics component such as a monolithic ceramic capacitor, is shown in U.S. Pat. Nos. 4,381,321; 4,393,808; 4,395,184 and 4,526,129, for example.

In the case where the chip electronics component is very small such that the same has dimensions, for example, of 0.8 mm, 1.6 mm and 0.8 mm in width, length and thickness, the conventional holding plate has the following problems to be solved, not only in manufacturing such a holding plate but also in using the same.

More specifically, in the case where the chip electronics component is very small, it is necessary to form very small holding holes into each of which the chip electronics component is press-inserted, but it is difficult to manufacture a holding plate having a number of small through holes. The reason is as follows: A rubber sheet member comprised in the holding plate is formed by a molding method, where a liquid rubber material is injected into a metal mold, the metal mold comprising molding pins for forming the through holes. In order to provide small inside widths of the through holes, it is necessary to make the molding pins very thin. However, if the pins are very thin, the same are easily bent by the pressure when the rubber material is injected into the metal mold, and therefore it is hard to obtain the rubber sheet in which desired through holes are formed.

Furthermore, in order to hold a large number of chip electronics components on the holding plate, it is necessary to make the area of the holding plate large. If the area of the holding plate is large, a warp of the holding plate takes place when the holding plate is moved, and therefore the end surfaces of all of the chip electronics components are not flush and even when the end surfaces thereof are simultaneously pressed against an electrically conductive paste to form electrodes on the end surfaces. Accordingly, the positions on the respective chip electronics components where the external electrodes are applied become uneven.

In addition, press pins are utilized to insert first end portions of the chip electronics components, onto which the external electrodes have been formed, into the through holes of the holding plate so as to expose the second end portions of the chip electronics components where the external electrodes are still not formed. It is necessary to make such press pins longer than the length of the chip electronics components by several times. On the other hand, if the chip electronics components are very small, it is necessary to make the press pin thin. Therefore, the press pins become weak and the press pins are easily bent in further press-inserting the chip electronics components into the through holes of the holding plate.

Furthermore, improved holding plates are proposed by the same assignee of the present invention, which are disclosed in, for example, Utility Model Application Laid-Open No. 78133/1985 laid open on May 31, 1985 and Utility Model Application Laid-Open No. 26026/1987 laid open Feb. 17, 1987, but none of them solves the above described disadvantage.

SUMMARY OF THE INVENTION

Therefore, it is a principal object of the present invention to provide a novel chip component holding plate in which no problem occurs even in the case of very small chip components.

Another object of the present invention is to provide a chip component holding plate in which no warp takes place even if the area thereof is made large.

A further object of the present invention is to provide a method for applying an electrode onto a chip electronics component by employing such a novel chip component holding plate.

In brief, a chip component holding plate in accordance with the present invention comprises a sheet member composed of an elastic material, a number of through holes being formed in the sheet member, each of which being able to elastically hold a chip component therein, and a magnet-attractable plate made of a magnet-attractable material and formed on at least one main surface of the sheet member, in which a number of through holes are formed at positions corresponding to the respective through holes of the sheet member.

A chip component is press-inserted into each of the through holes of the sheet member, whereby the respective chip components are held with respective end portions being exposed from the surface of the sheet member. With the chip components held by the through holes of the sheet member, the magnet-attractable plate is attracted by the magnetic force of a magnet plate having a plane surface. Then, the magnet plate is moved so that the exposed end portions of the chip components are pressed onto a paste layer made of an external electrode material, whereby an external electrode is formed on each exposed end portion of the chip component.

In accordance with the present invention, it is easy to manufacture a holding plate capable of holding a number of very small chip components and there is no problem in using the same. More specifically, in the holding plate in accordance with the present invention, a structure of the sheet member is very simple and a thickness thereof can be very thin, therefore, it is possible to form desired through holes each having a very small diameter or inside width. Furthermore, since the sheet member can be held by the magnet plate having a plane surface by means of the magnet-attractable plate, a warp of the holding plate does not occur even if the area of the holding plate is made large. Therefore, it is expected to increase the working-accuracy of the electrodes of the chip components. In addition, if the sheet member is made thin, it is possible to reduce the length of the press pins for press-inserting the chip components into the through holes, and therefore the strength of the press pins can be increased.

The above described objects and other objects, features, aspects and advantages of the present invention will become more apparent from the following detailed description of embodiments of the present invention when taken in conjunction with the accompanying drawings.

BRIEF DESCRIPTION OF THE DRAWINGS

FIG. 1, FIG. 2 and FIG. 3 are illustrative views showing one embodiment of a chip component holding plate in accordance with the present invention, wherein FIG. 1 is a magnified cross-sectional view showing a major portion thereof, FIG. 2 is a magnified plan view corresponding to FIG. 1 showing a major portion thereof, and FIG. 3 is a plan view showing the whole thereof.

FIG. 5A through FIG. 5D are illustrative view showing a process for applying external electrodes onto chip electronics components by utilizing the holding plate of the embodiment, wherein FIG. 5A shows a process for positioning chip electronics components over the respective through holes of the holding plate, FIG. 5B shows a process for press-inserting the positioned chip electronics components into he through holes, FIG. 5C shows a process for applying external electrodes by magnetically attracting the holding plate with a magnet plate, and FIG. 5D shows a process for transferring the chip electronics components to another holding plate.

DESCRIPTION OF THE PREFERRED EMBODIMENTS

Figure 1:
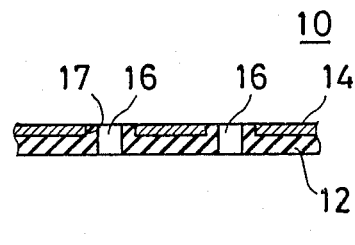
Figure 2:
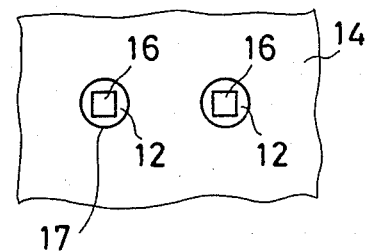
Figure 3:
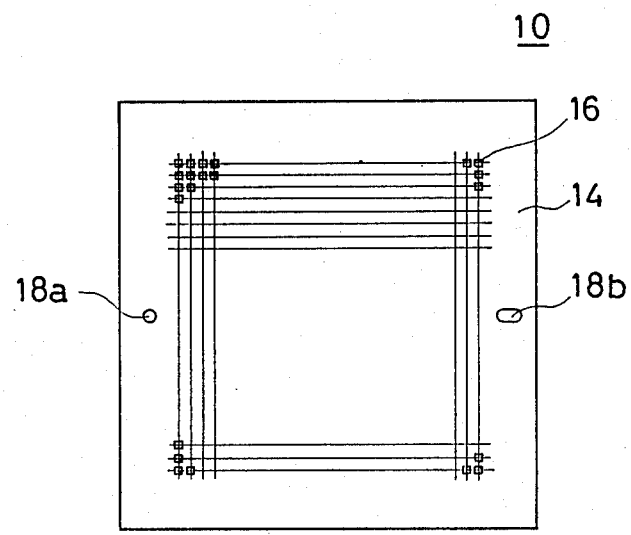

Referring to FIGS. 1-3, a chip component holding plate 10 includes a laminated and unified structure of a sheet member 12 composed of an elastic material such as silicon rubber and a magnet-attractable plate 14 composed of magnet-attractable material, for example, an iron family alloy having flexibility, such as stainless steel (SUS430).

In the sheet member 12, a number of through holes 16 are formed, arrayed in a column direction and in a row direction. Each through hole 16 is formed as a rectangular shape in cross section, an inside width of which is approximately the same as an outside width of each electronics component (not shown) or slightly smaller in comparison therewith. The reason why the through holes 16 have such a size is to be able to hold the chip electronics components by the elastic force of the sheet member, by press-inserting the chip electronics components into the respective through holes 16.

In the magnet-attractable plate 14, a number of circular through holes 17 are formed, having a diameter larger than the inside widths of the through holes 16 at respective portions of the plate 14 corresponding to the respective ones of the through holes 16 of the sheet member 12. Each of the through holes 17 surrounds one of the through holes 16. The magnet-attractable plate 14 is utilized to support the holding plate 10 by being magnetically attracted by a magnet plate.

Positioning holes 18a and 18b may be formed near the middle of the both side portions in the column direction as shown (or alternatively the row direction) of the holding plate 10.

Figure 4:
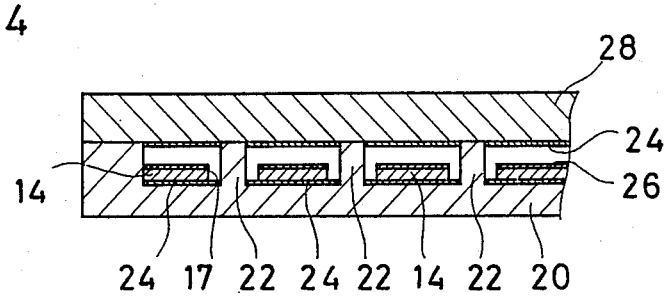
FIG. 4 is a cross-sectional view showing a manufacturing method for producing the embodiment as shown in FIGS. 1-3.

Next, in reference to FIG. 4, a method of manufacturing the holding plate 10 will be described. In a first metal mold (lower metal mold) 20, a recess is provided having a form equal to a plan form of the holding plate 10, and a depth to the recess is selected to be approximately equal to a thickness of the holding plate 10. On the bottom surface of the recess, molding pins, 22 each having a rectangular form in cross-section, so as to form the respective quadrilateral through holes 16 of the sheet member 12, are provided in an upright fashion. Then, a mold lubricant 24 is painted on the bottom surface of the recess of the first metal mold 20.

The magnet-attractable plate 14, in which the through holes 17 corresponding to the through holes 16 are formed by means of a press-working or an etching, is also prepared. A primer 26 is painted on the upper surface of the magnet-attractable plate 14, and the magnet-attractable plate 14 is accommodated in the recess of the first metal mold 20. At this time, the magnet-attractable plate 14 is positioned so that the respective molding pins 22 are inserted into the respective through holes 17 and the lower surface of the plate 14 comes into contact with the bottom surface of the recess, that is, the mold lubricant 24. Then, a liquid silicon rubber which is a material of the sheet member 12 is injected into the first metal mold 20.

A second metal mold 28 (with a mold lubricant 24 painted on the lower surface) is positioned on the first metal mold 20. Thereafter, the combination of the first and second metal molds 20 and 28 is heated, so that the silicon rubber which was previously injected is set. Thus, the sheet member 12, which is composed of silicon rubber and has the through holes 16 as shown in FIGS. 1-3 and the magnet-attractable plate 14, is molded in a one-piece fashion.

Next, referring to FIGS. 5A-5D, and example of a process for applying external electrodes onto the chip electronics components by utilizing the holding plate 10 of the embodiment will be described.

Figure 5A:
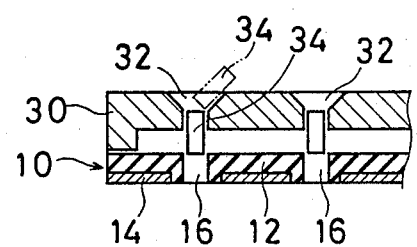

First, as shown in FIG. 5A, the holding plate 10 is suitably positioned so that the magnet-attractable plate 14 is faced downward and a loading plate 30 is put on the upper surface of the sheet member 12. The loading plate 30 has a number of funnel-shaped guide holes 32, each of which is formed at a position corresponding to a respective one of the through holes 16 of the sheet member 12, that is, the holding plate 10. Then, a number of chip electronics components 34 such as monolithic capacitors are supplied at the upper surface of the loading plate, and thereafter the holding plate 10 and the loading plate 30 are shaken back and forth and right and left. At this time, each of the chip electronics components 34 falls through one of the guide holes 32 and is brought to one of the through holes 16.

Figure 5B:
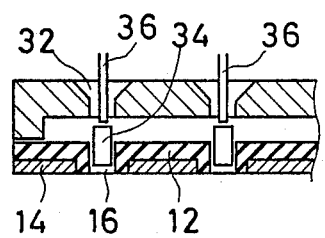

Subsequently, as shown in FIG. 5B, press pins 36 are inserted from above the guide holes 32 so as to go through the guide holes 32. By inserting the press pins 36, first end portions (the lower portions in FIG. 5B) of the respective chip electronics components are press-inserted into the respective through holes 16 of the sheet member 12, whereby the respective chip electronics components 34 are elastically held by the respective through holes 16. That is, the components 34 are held in the sheet member 12 with the other (second) end portions thereof projected from the upper surface of the sheet member 12. At this time, if the insertion length or depth of each of the press pins 36 has been made constant, the length of the second end portions (the upper end portions in FIG. 5B) of the respective chip electronics components 34 projected from the surface of the sheet member 12 becomes constant and even.

Figure 5C:
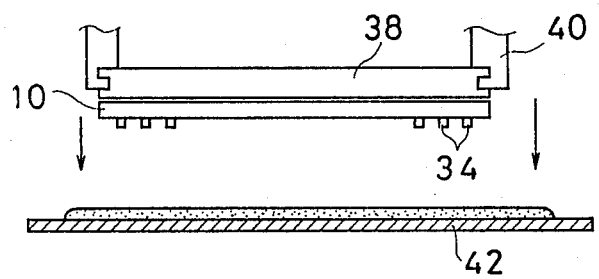

Next, as shown in FIG. 5C, the holding plate 10 which is elastically holding the chip electronics components 34 in the through holes 16 is reversed so that the magnet-attractable plate 14 is faced upward. In this state, the magnet-attractable plate 14 is attracted by the magnetic force of a magnet plate 38. At this time, since the magnet-attractable plate 14 has flexibility, no warp of the holding plate 10 occurs if the attracting surface of the magnet plate 38 is flat. Therefore, the second end portions (now the lower end portion, as seen in FIG. 5C) of the respective chip electronics components 34 which are projected downward from the sheet member 10 become even.

The magnet plate 38 is supported by a supporting member 40 so as to hang downward. Under the magnet plate 38, a plate 42 is located, on which an electrical conductive paint made of paste such as silver which is material of an external electrode is thinly spread. Then, the support member 40 and thus the magnet plate 38 is moved downward, the respective second end portions of the chip electronics components 34 held by the holding plate 10 are pressed onto the plate 42. Therefore, the electrical conductive paint is adhered to each of the respective end portions of the chip electronics components 34. Thereafter, the support member 40, and with it magnetic plate 38, is moved upward, and the electrical conductive paint adhered on the chip electronics components 34 is heated and dried. Thus, the external electrodes are simultaneously formed onto the respective second end portions of the chip electronics components 34 which are exposed from the sheet member 12 of the holding plate 10.

Figure 5D:
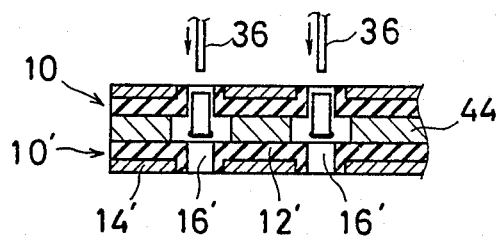

Then, as shown in FIG. 5D, a further holding plate 10′, having the same structure as the holding plate 10, is prepared with its magnet-attractable plate 14′ facing downward. The holding plate 10, holding the chip electronics components 24 on which the external electrodes have been formed at the second end portions thereof in the previous step, is brought above the further holding plate 10′ and separated by a spacer 44, and the plates are positioned so that the through holes 16 and 16′ correspond to each other. Thereafter, the press pins 36 are inserted from above the holding plate 10 so that the respective chip electronics components 34 are transferred to the further holding plate 10′. Accordingly, the second end portions of the chip electronics components on which the external electrodes have been applied are inserted into the respective through holes 16′ of the further holding plate 10′ so that now the first end portions of the chip electronics components 34 on which the external electrodes are not still applied are projected from the surface of the sheet member 12′. In that state, the respective chip electronics components 34 are elastically held by the further holding plate 10′.

The further holding plate 10′ is then processed as shown and described previously in connection with FIG. 5C, whereby external electrodes are applied into the first end portions of the chip electronics components 34. After heating and drying the external electrodes, the chip electronics components 34 are pushed out by the press pins 36 from the holding plate 10′. The, the external electrodes thus applied to the chip electronics components 34 are baked.

Figure 6:
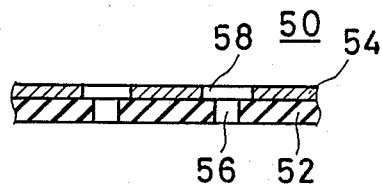
FIG. 6 is a magnified cross-sectional view showing a major portion of a second embodiment of a chip component holding plate in accordance with the present invention.

In a second embodiment as shown in FIG. 6, holding plate 50 is constituted by a sheet member 52 composed of silicon rubber or the like and a magnet-attractable plate 54 composed of stainless steel or the like which are adhered to each other. More specifically, in the sheet member 52, a number of through holes 56 are formed, arrayed in a column direction and in a row direction at predetermined intervals by a press-working or an injection molding process. On the other hand, on the magnet-attractable plate 54, a number of through holes 58 each having a diameter larger that the inside width of each of the through holes 56 are formed by a press-working or an etching process at positions each corresponding to one of the through holes 56 of the sheet member 52. Adhesion agents are painted on the surfaces of the sheet member 52 and the magnet-attractable plate 54, which are faced to each other, and then both are positioned so that the through holes 56 and 58 become coincident, and adhered.

With the holding plate 50 in which the sheet member 52 and the magnet-attractable plate 54 are adhered to each other, there is an advantage that the same is manufactured more inexpensively, since there is no need to use a specific metal mold.

Figure 7:
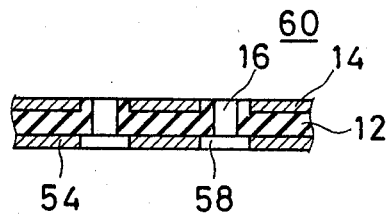
FIG. 7 is a magnified cross-sectional view showing a major portion of a third embodiment of a chip component holding plate in accordance with the present invention.

In a third embodiment as shown in FIG. 7, a holding plate 60 includes a further magnet-attractable plat 54 which is adhered to the rear surface of the holding plate 10 or 50 as shown in FIG. 1 or FIG. 6.

Figure 8:
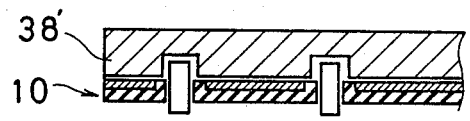
FIG. 8 is a magnified cross-sectional view showing a major portion of a fourth embodiment of the invention, employing another example of the magnet plate.

In addition, it is possible for a thickness of the holding plate 10, 50 or 60 as shown in FIG. 1, FIG. 6 or FIG. 7 to be made thinner than a length of the chip electronics component so that both end portions of the chip electronics component 34 are projected from both surfaces of the holding plate. In this case, the holding plate which holds the chip electronics components 34 is magnetically attracted by a magnet plate 38′ which has recesses for accommodating the projected end portions of the chip electronics components as shown in FIG. 8. In this embodiment, there is no need to transfer the chip electronics components to a further holding plate to apply external electrodes onto both end portions of the chip electronics components, and therefore the process for press-inserting the chip electronics components by the press pins 36 only needs to be performed one time.

In the embodiments shown, each of the through holes of the sheet member for holding the chip electronics components has been formed with a rectangular shape in cross-section, but the shape thereof may also be other shapes, such as circular in cross-section. In addition, the magnetically-attractable plate 14 or 54 may be composed of a material which has a magnetic force itself. In this case, the magnet plate 38 or 38′ may be replaced by a mere supporting plate which does not have a magnetic force.

In addition, in these embodiments, the electrically conductive paste such as silver is spread on the plane plate; however, such a paste may be impregnated in a porous member such as a sponge or stored in a paint tub.

Although the present invention has been described and illustrated in detail with respect to embodiments thereof, it is clearly understood that the same is by way of illustration and example only and is not to be taken by way of limitation, the spirit and scope of the present invention being limited only by the terms of appended claims.

What is claimed is:

1. A chip component holding plate for holding a plurality of chip components while simultaneously applying electrode material on one end of each of the chip components being held by the holding plate, comprising:
   a sheet member composed of an elastic material;
   a number of through holes being formed in said sheet member, each of which being able to elastically hold a chip component therein with one end of each said chip component projecting from one surface of said sheet member; and
   a magnet-attractable plate composed of a magnetically-attractable material and formed on at least one surface of said sheet member, a number of through holes being formed on said magnet-attractable plate at positions each of which corresponds to one of said through holes of said sheet member, said magnet-attractable plate being composed of a flexible material, said chip component holding plate thereby being flexible as a whole.

2. A chip component holding plate in accordance with claim 1, wherein said magnet-attractable plate is integrally, formed with said sheet member.

3. A chip component holding plate in accordance with claim 1, wherein said magnet-attractable plate is adhered to said sheet member.

4. A chip component holding plate in accordance with claim 1, further comprising a further magnet-attractable plate formed on the other surface of said sheet member.

5. A chip component holding plate in accordance with claim 4, wherein said further magnet-attractable plate is, integrally formed with said sheet member.

6. A chip component holding plate in accordance with claim 4, wherein said further magnet-attractable plate is adhered to said sheet member.

7. A chip component holding plate in accordance with claim 1, wherein said magnet-attractable plate is composed of an iron family alloy.

8. A chip component holding plate in accordance with claim 1, wherein said sheet member is composed of a silicon rubber.

9. A method for applying an electrode onto the chip electronics component by utilizing a holding plate for holding a plurality of chip components while simultaneously applying electrode material on one end of each of the chip components being held by the holding plate, said holding said comprising a sheet member composed of an elastic material, a number of through holes being formed in said sheet member, each of which being able to elastically hold chip components therein with one end of each said chip component projecting from one surface of said sheet member, and a magnet-attractable plate composed of a magnetically-attractable material and formed on at least one surface of said sheet member, a number of through holes being formed on said magnet-attractable plate at positions each of which corresponds to one of said through holes of said sheet member, said magnet-attractable plate being composed of a flexible material, said chip component holding plate thereby being flexible as a whole, said method comprising the steps of:
   (a) press-inserting a chip electronics component into each through hole of said sheet member so that one end portion thereof is exposed;
   (b) magnetically attracting said magnet-attractable plate by another substantially flat plate by a magnetic force acting therebetween to closely magnetically adhere said two plates together; and
   (c) moving said plate to move said sheet member so that the respective end portions of the chip electronics components are pressed against an electrode paste.

10. A method in accordance with claim 9, further comprising the steps of:
   (d) transferring said chip electronics components onto which said electrode paste has been painted to a further holding plate so that the other end portions of the chip electronics components on which the electrode paste is still not painted are exposed from a sheet member of said further holding plate;
   (e) magnetically attracting the magnet-attractable plate of said further holding plate by another plate by a magnetic force acting therebetween; and
   (f) moving said other plate to move said further holding plate so that the other end portions of said chip electronics components held by said further holding plate are pressed to an electrode paste.

11. A method in accordance with claim 9, including:
   disposing said electrode paste on a substantially flat plate; and
   pressing said chip components against said flat plate so that their exposed ends become flush and the electrode paste is applied evenly thereto.

* * * * *